US012730965B2

(12) United States Patent
Lo et al.

(10) Patent No.: US 12,730,965 B2
(45) **Date of Patent: *Sep. 8, 2026**

(54) HIGH-PERFORMANCE MICROCODED TEXT PARSER

(71) Applicant: Microsoft Technology Licensing, LLC, Redmond, WA (US)

(72) Inventors: Daniel Lo, Bothell, WA (US); Blake D. Pelton, Redmond, MA (US)

(73) Assignee: MICROSOFT TECHNOLOGY LICENSING, LLC, Redmond, WA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/629,057

(22) Filed: Apr. 8, 2024

(65) Prior Publication Data

US 2024/0273287 A1 Aug. 15, 2024

Related U.S. Application Data

(63) Continuation of application No. 17/177,995, filed on Feb. 17, 2021, now Pat. No. 11,989,508.

(Continued)

(51) Int. Cl.

| | |
|---|---|
| ***G06F 40/205*** | (2020.01) |
| ***G06F 16/83*** | (2019.01) |
| ***H03K 19/173*** | (2006.01) |

(52) U.S. Cl.

CPC ............ *G06F 40/205* (2020.01); *G06F 16/83* (2019.01); *H03K 19/1737* (2013.01)

(58) Field of Classification Search

None

See application file for complete search history.

(56) References Cited

U.S. PATENT DOCUMENTS

| | | |
|---|---|---|
| 6,009,258 A | 12/1999 | Elliott |
| 7,307,453 B1 | 12/2007 | Maitland |

(Continued)

FOREIGN PATENT DOCUMENTS

| | | |
|---|---|---|
| CN | 109564530 A | 4/2019 |
| TW | 202026858 A | 7/2020 |

OTHER PUBLICATIONS

First Examination Report Received for India Application No. 202317013586, mailed on Aug. 26, 2025, 11 pages.

(Continued)

*Primary Examiner* — Nicole A K Schmieder
(74) *Attorney, Agent, or Firm* — Weaver IP L.L.C.

(57) ABSTRACT

The performance of a text parser implemented with a state machine is improved by reducing a critical dependence path. In one aspect, all possible current states for a given text input are read from a state table circuit, and the correct next state and output are then selected therefrom by an output multiplexer based on the current state, removing dependence on the current state from the table read, and allowing the read(s) to be pipelined. Further, multiple input units are configured to operate on multiple text characters in parallel, with each input unit propagating outputs for its state table circuit to the next downstream input unit. Each downstream input unit is configured to use the propagated states to provide the proper outputs to appropriates multiplexer inputs. The number of possible output states may be dynamically reduced, thereby reducing the size of the output multiplexer needed to select the next state.

20 Claims, 10 Drawing Sheets

Related U.S. Application Data

(60) Provisional application No. 63/078,744, filed on Sep. 15, 2020.

(56) References Cited

U.S. PATENT DOCUMENTS

| | | | | |
|---|---|---|---|---|
| 2004/0083221 | A1 | 4/2004 | Dapp | |
| 2004/0083466 | A1* | 4/2004 | Dapp | G06F 40/143 717/110 |
| 2005/0171943 | A1* | 8/2005 | Ichino | G06F 16/90344 |

OTHER PUBLICATIONS

Pei, et al., "Registor: A Platform for Unstructured Data Processing Inside SSD Storage", Association for Computing Machinery, vol. No. 18, Jun. 2018, pp. 13-25.

Sidhu et al., "Fast Regular Expression Matching Using FPGAs," In Proceedings of the 9th Annual IEEE Symposium on Field-Programmable Custom Computing Machines (FCCM'01), Apr. 2001, 12 Pages.

Communication pursuant to Article 94(3) received for European Application No.21735478.6, mailed on Mar. 20, 2026, 09 Pages.

Examination Report Received in Indian Patent Application No. 202317013588, mailed on Aug. 12, 2025, 12 pages Notice of Allowance mailed on Sep. 5, 2023, in U.S. Appl. No. 17/832,379, 9 pages.

Notice of Allowance Received for Taiwan Application No. 111101407, mailed on Aug. 28, 2025, 6 pages. (English translation Provided).

First Office Action Received for Chinese Application No. 202180062997.1, mailed on Mar. 23, 2026, 10 Pages (English Translation Provided).

Chang Ge, etc., "Speculative Distributed CSV Data Parsing for Big Data Analytics" Proceedings of the 2019 International Conference on Management of Data (SIGMOD ' 19), Jul. 5, 2019.

Communication pursuant to Article 94(3) EPC received for EP Application No. 21737907.2 mailed on July 21, 2026, 09 Pages.

* cited by examiner

1000

| current state | code point[0] | | code point[1] |
|---|---|---|---|
| 0 | 1 | | 2 |
| 1 | 3 | | 3 |
| 2 | 2 | | 0 |
| 3 | 0 | | 1 |

FIG. 10

HIGH-PERFORMANCE MICROCODED TEXT PARSER

CROSS-REFERENCE TO RELATED APPLICATIONS

This application is a continuation of U.S. patent application Ser. No. 17/177,995, filed Feb. 17, 2021, which claims priority to U.S. Provisional Patent Application Ser. No. 63/078,744, filed Sep. 15, 2020, the entireties of which are incorporated by reference herein.

BACKGROUND

A microcoded text parser allows parsing of different text formats through a microcode program that describes how different characters are handled. For example, data may be arranged in a text file as comma-separated values (with such a file commonly referred to as a CSV file, or as being in CSV format), whereby tabular data is stored as plain text, with each line including the same number of fields. A file in CSV format uses ordinary text commas as a boundary character between fields. When reading a CSV file, each character must be inspected to determine if it is a comma, and if so, to either begin or complete input of the field. Thus, the operating state of a CSV parser changes over time depending on what character is being read or has been read. Moreover, fields in a CSV file may themselves include commas as part of the data of that field, and special handling of such commas is necessary for the parser to correctly parse the file. For example, consider the following two comma separated values: abc, "def, hij". The first comma encountered when reading these characters sequentially starting from 'a' causes the parser to change state (i.e., finish inputting the field 'abc', and begin inputting the next field). Similarly, the second field is quoted and similarly changes state when the first "character is encountered. In that instance, however, the parser changes to a literal input state such that characters encountered thereafter are simply read in as-is until the next "character is encountered, thereby permitting otherwise special characters (e.g., the , of the field def, hij) to be included in fields. Similar text parsing requirements are necessary for parsing text in other formats as well such as, for example, JavaScript Object Notation ("JSON") or Hypertext Markup Language ("HTML").

Such parsers may be implemented through a table-based state machine by describing the parser state transitions in a table-based format, and providing a means to query the table for appropriate output(s) and next state based on the current input(s) and state. The performance of state machines is typically limited because of the dependence of each new input on the previous state. For table-based state machines, this performance is limited due to the table lookup for each iteration. In addition, this dependence makes it difficult to parallelize across inputs.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Methods and systems are described herein that implement an improved text parser including a table-based state machine that reduces a critical dependence path. In one aspect, all possible current states for a given input are read from a state table circuit, and the correct next state and output are then selected from amongst these by an output multiplexer based on the current state thus removing any dependence on the current state from the table read, and allowing the read(s) to be pipelined.

In a further aspect, multiple input units are configured to operate on multiple inputs in parallel, with each input unit propagating its state table circuit for its current input to the next downstream input unit. Each downstream input unit is configured to use the propagated state table circuit to provide the state table circuit reads to the proper output multiplexer input.

In an additional aspect, embodiments may dynamically reduce the number of possible output states for a given input thereby reducing the size of the output multiplexer needed to select the next state. A further extension dynamically reduces the number of states for a given input.

Further features and advantages, as well as the structure and operation of various examples, are described in detail below with reference to the accompanying drawings. It is noted that the ideas and techniques are not limited to the specific examples described herein. Such examples are presented herein for illustrative purposes only. Additional examples will be apparent to persons skilled in the relevant art(s) based on the teachings contained herein.

BRIEF DESCRIPTION OF THE DRAWINGS/FIGURES

The accompanying drawings, which are incorporated herein and form a part of the specification, illustrate embodiments of the present application and, together with the description, further serve to explain the principles of the embodiments and to enable a person skilled in the pertinent art to make and use the embodiments.

FIG. 10 shows a diagram of a trace through a table, in accordance with an embodiment.

Figure 1:
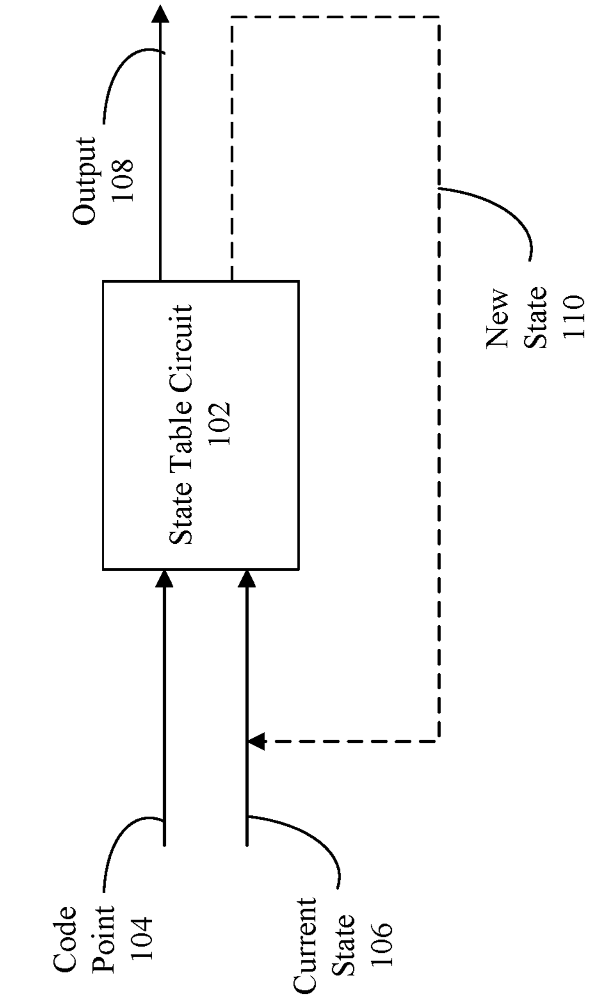
FIG. 1 depicts an example table-based state machine, according to an embodiment.

The features and advantages of embodiments will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The present specification and accompanying drawings disclose one or more embodiments that incorporate the features of the present invention. The scope of the present invention is not limited to the disclosed embodiments. The disclosed embodiments merely exemplify the present invention, and modified versions of the disclosed embodiments are also encompassed by the present invention. Embodiments of the present invention are defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the discussion, unless otherwise stated, adjectives such as "substantially" and "about" modifying a condition or relationship characteristic of a feature or features of an embodiment of the disclosure, are understood to mean that the condition or characteristic is defined to within tolerances that are acceptable for operation of the embodiment for an application for which it is intended.

Numerous exemplary embodiments are described as follows. It is noted that any section/subsection headings provided herein are not intended to be limiting. Embodiments are described throughout this document, and any type of embodiment may be included under any section/subsection. Furthermore, embodiments disclosed in any section/subsection may be combined with any other embodiments described in the same section/subsection and/or a different section/subsection in any manner.

II. Example Embodiments

Embodiments disclosed herein provide a high-performance text parser incorporating a table-based state machine that enables extensive pipelining to hide latencies, and permit high clock frequency. An overview of parsing a comma-separated values ("CSV") file in the context of a state machine will now be described.

An example CSV file may be understood with reference to the following example table:

Example Tabular Data Table

| First Name | Last Name | Phone Number |
|---|---|---|
| John | Doe | 800-555-1212 |
| Jane | Doe | 987-654-3210 |

An example CSV text file corresponding to the tabular data of the table shown immediately above is shown below:

Example CSV File

```
"First Name", "Last Name", "Phone Number"
"John", "Doe", "800-555-1212"
"Jane", "Doe", "987-654-3210"
```

When Example CSV File shown above is opened for reading, embodiments of a CSV parser discussed herein below accepts the text shown above as it is read in (either one character at a time, or in multiple character chunks), and parses the text to place the values into, for example, the table fields of Example Tabular Data Table shown above (Note, a CR-LF at the end of each line of Example CSV File is implicit and not shown). A couple of things are apparent from a comparison of Example CSV File and the corresponding Example Tabular Data Table. First, the double-quotes (i.e., the " characters) present in Example CSV File are not shown in the data fields of Example Tabular Data Table. In this example, the double-quotes serve to encapsulate data that may include whitespace or other special characters (such as, e.g., commas). Second, and consistent with the definition of the CSV file format, the commas serve as field delimiters used by the parser to understand when a field begins and ends. A qualitative functional description of a table-based state machine CSV parser follows herein immediately below.

In an embodiment, the CSV parser reads one text character at a time from, for example, Example CSV File as shown above. Each text character may comprise, for example, one or more Unicode code points. In an embodiment, the first character read from the file forms the start of the characters of the first field to be parsed from the file. In other embodiments, however, the CSV file may include header or control fields including metadata that may also be parsed and subsequently used as control metadata. For example, such metadata may include information indicating that the comma-separated values thereafter included in the CSV file are encoded according to a Unicode encoding format (e.g., UTF-8 or UTF-16, etc.). For the remainder of the description herein, it is assumed that disclosed embodiments are operating to parse a CSV file that uses UTF-8 character encoding. It should be further assumed that the UTF-8 characters of the CSV text file are decoded to a stream of Unicode code points prior to being parsed by the disclosed embodiments, and details of decoding UTF-8 encoded characters to such code points is omitted.

With continued reference to Example Tabular Data Table and Example CSV File illustrated above, and assuming that a stream of Unicode code points corresponding to Example CSV File is being provided, embodiments may transition the state machine to a character-checking state whereby the Unicode code point corresponding to the first character is compared to a double-quote. Where the character is a double quote, the parser is signaled that each and every character that follows up to the next double quote should be included literally in the parsed data field output from the parser. Where the character is a comma, the parser is signaled that the end of the current field has been reached, and the set of characters parsed thus far comprise the entirety of the data field, and should be saved or otherwise output as such.

From the qualitative functional description of parser embodiments described herein above, it may be appreciated that the parser may be implemented as a Mealy-type state machine whereby the state machine accepts input data in a current state, and is caused to generate output data/signals and a new state. For example, FIG. 1 depicts an example table-based state machine 100, according to an embodiment. Table-based state machine 100 includes a state table circuit 102. State table circuit 102 may be implemented in hardware (e.g., an electrical circuit including transistors, logic gates, electrical components, etc.) and is configured to receive/accept a code point 104 and a current state 106 (also referred to herein as "current operating state") as inputs. State table circuit 102 is configured to thereafter generate an output 108 and a new state 110 (also referred to herein as "new operating state"). A table-based state machine includes hardware that implements a programmable state machine by encoding state transitions and outputs through a lookup table. For example, consider the following example state transition table, State Transition Table A:

TABLE A

| State Transition | | | |
|---|---|---|---|
| Code Point 104 | Current State 106 | Output 108 | New state 110 |
| 0 | 0 | 0 | 0 |
| | 1 | 1 | 1 |
| 1 | 0 | 1 | 1 |
| | 1 | 0 | 0 |

State Transition Table A enumerates all possible state transitions for this example. That is, State Transition Table A enumerates a new state (i.e., New state 110) for every possible combination of input (i.e. code point 104) and current state (i.e., current state 106. Such a state transition table may be referred to as a dense state transition table. Embodiments may employ a dense state transition table whenever the total number of states is relatively small. In other embodiments, however, and as described in further detail herein below, a sparse state transition table may be employed.

State table circuit 102 may be implemented in hardware in various different ways, as known in the art to persons skilled in the relevant art(s), to provide a lookup-table mechanism whereby upon being provided with code point 104 and current state 106 as inputs, state table circuit 102 generates output 108 and new state 110 as outputs with the values of such outputs dictated by its state transition table (e.g., State Transition Table A). For example, state table circuit 102 may be implemented in the form of transistors, logic gates, an Application Specific Integrated Circuit (ASIC), a configurable circuit such as in a Field Programmable Gate Array (FPGA), a Complex Programmable Logic Device (CPLD), and/or fabricated directly on silicon or other semiconductor materials using photolithographic techniques as known in the relevant art(s). As such, state table circuit 102 may be implemented using microprogramming techniques as also known in the relevant art(s), and one or more state transition tables associated with state table circuit 102 may likewise include microprogramming instructions, microcodes, one or more addresses for in-memory microcode subroutines, and the like. Thus, state table circuit 102 is not merely an arrangement of data, but instead exposes lookup-table functionality whereby outputs and new states may be retrieved from a corresponding state transition table stored in memory. For example, and with reference to State Transition Table A shown herein above, when code point 104 is 1 and current state 106 is 1 and are provided to state table circuit 102 as inputs, state table circuit 102 will provide 0 for output 108, and 0 for new state 110 as outputs. Note that in the context of Unicode CSV parser embodiments discussed herein, although inputs such as code point 104 comprise Unicode code points, such code points are depicted in a simplified form such as 0 or 1 herein.

The performance of table-based state machine 100 is limited in at least two aspects. First, each input is processed sequentially because the new state depends on the previous input. Second, the processing time of each iteration of the state machine (i.e., the "iteration interval") is bottlenecked by the relatively slow memory access required to look up an entry in the state table circuit, and to output new state 110. That is, no matter how fast the next code point 104 is provided to the state machine, generation of the next output 108 is blocked until such time that new state 110 is generated and fed back to become current state 106. Moreover, an increase in the time it takes to calculate output 108 likewise need not affect iteration time because calculating output 108 may be done in parallel with beginning to process the next code point 104. From these facts, it may be appreciated that the iteration interval of table-based state machine 100 is governed by the amount of time required to look up and output new state 110. Based on these observations, we now turn to description of embodiments that are configured to reduce the iteration interval by removing any dependence on the current state or previous inputs from the state table lookup.

Figure 2:
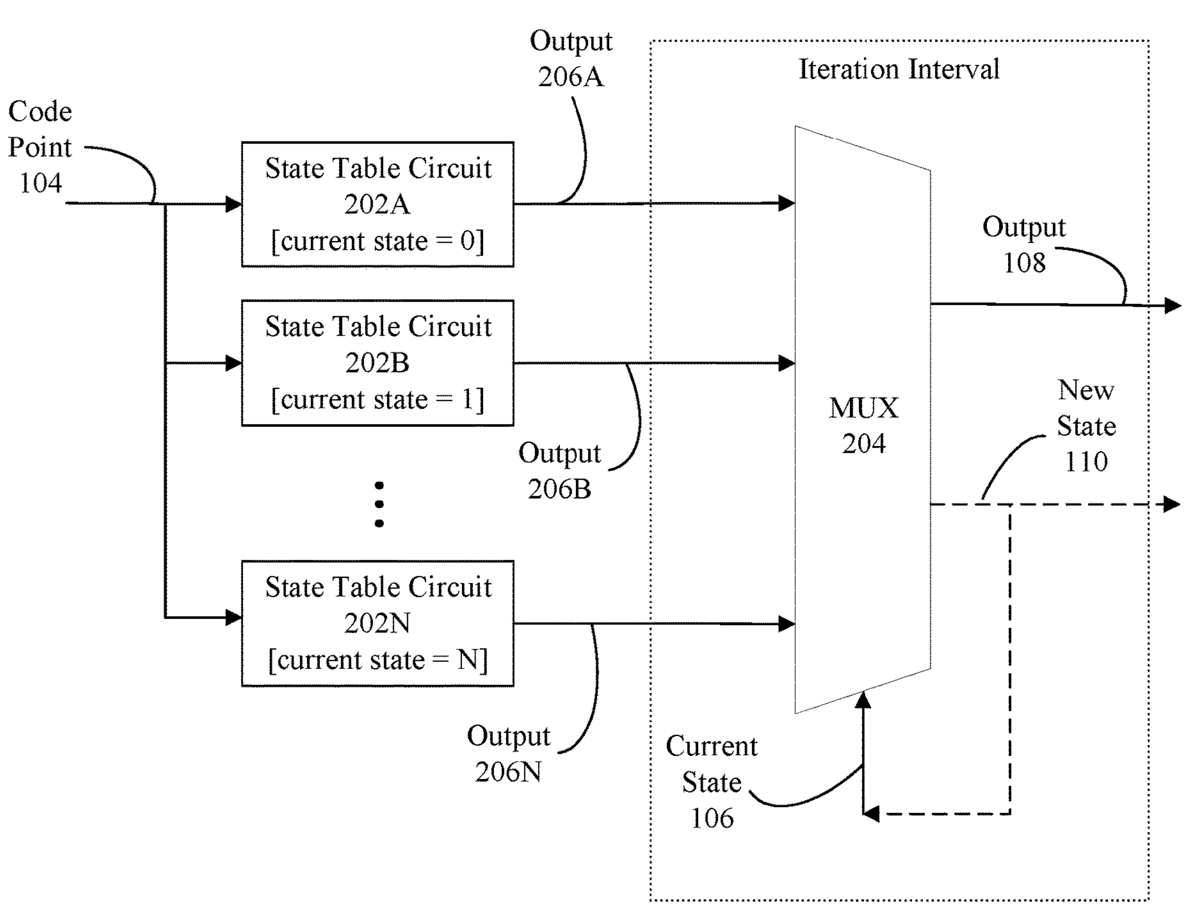
FIG. 2 depicts an example table-based state machine with a reduced iteration interval, according to an embodiment.

FIG. 2 depicts an example table-based state machine 200 with a reduced iteration interval, according to an embodiment. Table-based state machine 200 includes state table circuits 202A-202N and multiplexer ("MUX") 204. Each of state table circuits 202A-202N corresponds to a sub-table of a complete state transition table (such as, e.g., State Transition Table A shown above), wherein each of the sub-tables only includes information for one possible current state value. For example, state table circuit 202A includes state transition information that corresponds only to a current state of 0, state table circuit 202B includes state transition information that corresponds only to a current state of 1, and so forth. When a new value for code point 104 is received and provided to each of state table circuits 202A-202N, each such table looks up and provides the state and output that corresponds to code point 104 for each table as input to MUX 204. Note, for the sake of clarity in FIG. 2, the state and output from each of state table circuits 202A-202N is depicted as signals lines denoted as Outputs 206A-206N. It should be understood, however, that Outputs 206A-206N each include two independent signals (i.e., the state and output looked up in the table based on the fixed state corresponding to a particular state table circuit 202A-202N, and code point 104). Moreover, although each of state table circuits 202A-202N is depicted as an independent circuit, it should be understood that embodiments are not so limited. For example, state table circuits 202A-202N may comprise one static random-access memory ("SRAM") that contains all the state transition tables for each of state table circuits 202A-202N.

As discussed above, MUX 204 accepts outputs 206A-206N from the state table circuits 202A-202N, respectively, and is further configured to receive current state 106 as input. MUX 204 (or multiplexor 204) may also be referred to as a data selector, and is a device formed of electrical circuits (e.g., transistors, logic gates (such as AND gates, NAND gates, OR gates, XOR gates), etc.) that selects between several analog or digital input signals and forwards the selected input to a single output line. Moreover, although MUX 204 is depicted as an N-input MUX, due to each of output 206A-206N including two signals, MUX 204 may also be configured as two independent N-input MUXES. One such MUX is used for selecting the correct output 206A-output 206N to route to output 108 based on current state 106, and the other MUX is used for selecting the correct input to route to new state 110. It should be noted that current state 106 will be updated to reflect new state 110 after every iteration.

Table-based state machine 200 as depicted in FIG. 2 removes the state table lookup/read from the dependence path inasmuch as each table lookup depends only on the current input, and the memory reads corresponding to the state table reads may be pipelined. Accordingly, the iteration interval for table-based state machine 200 depends only on the time it takes for MUX 204 to route the correct output and state from the state tables output 108 and new state 110, respectively. In embodiments, and depending on the size of the state machine (i.e., the number of possible states of the machine), operation of MUX 204 may be substantially faster than the table reads which, when combined with pipelining of such reads, enables embodiments to be switched at very high frequencies. Embodiments may implement further performance enhancement techniques as described herein below.

As discussed above, table-based state machine 100 suffers from a further drawback that each input is processed sequentially because the new state depends on the previous input. That is, because each input depends on the new state produced by the previous input, there is a dependence that prevents full parallelization. The embodiments described above reduce the dependence on knowing the current state for the most expensive part of the processing (i.e., the state table lookups), but do not necessarily achieve such state independence when used as a parallel input state machine.

Figure 3:
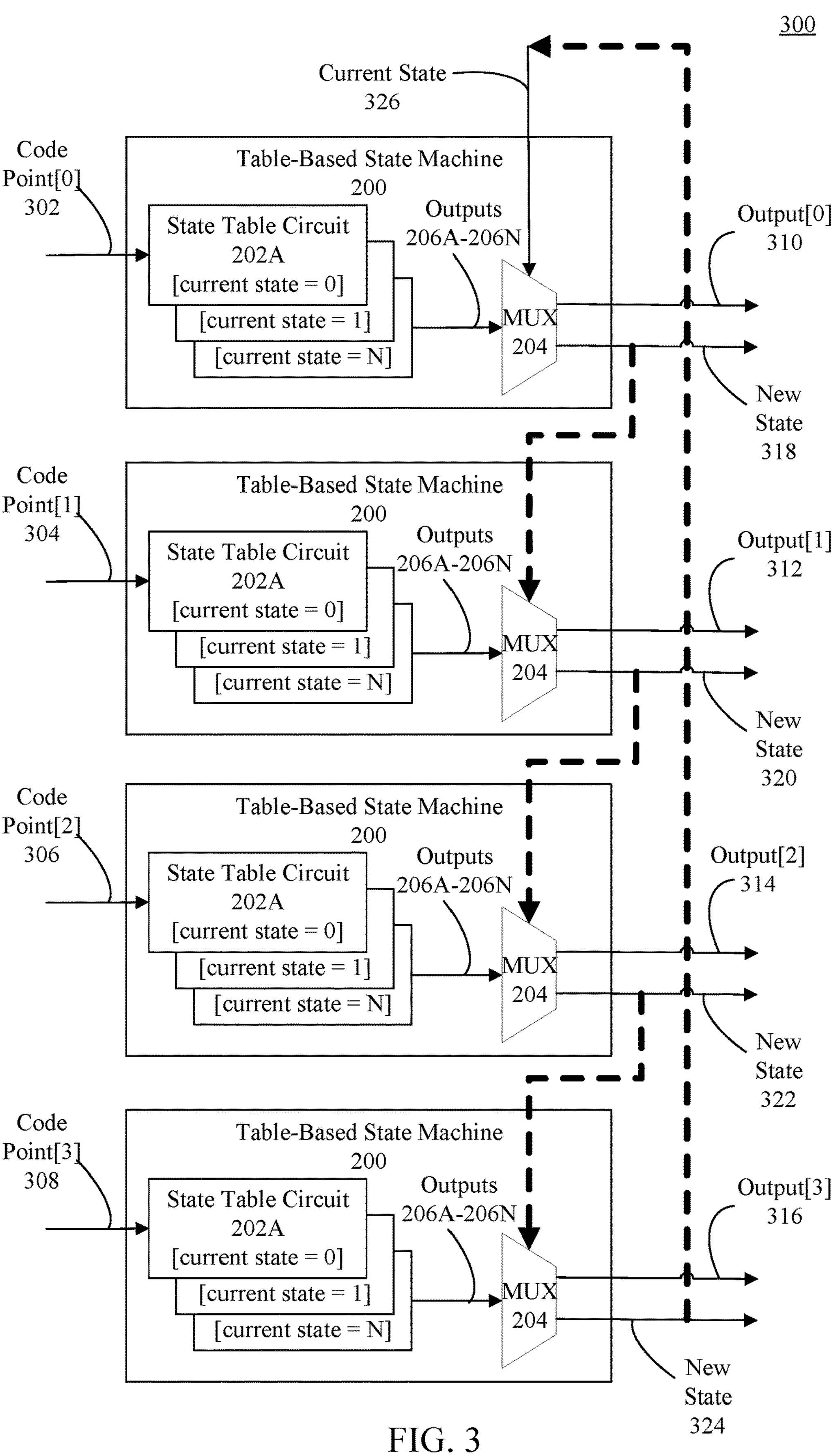
FIG. 3 depicts an example naïve implementation of a state machine configured to process inputs in parallel, according to an embodiment.

Consider, for example, FIG. 3 which depicts a naïve implementation of a state machine 300 configured to process inputs in parallel, according to an embodiment. State machine 300 includes four instances of table-based state machine 200, which each include respective instances of state table circuits 202A-202N. Each instance of table-based state machine 200 receives a corresponding one of Inputs 302-308 (denoted as Code Point[0]-Code Point[3], respectively) and generates a corresponding one of Outputs 310-316 (denoted as Output[0]-Output[3], respectively). Furthermore, each of New States 318-324 is fed forward to MUX 204 of the next instance of table-based state machine 200, with New State 324 ultimately being fed back and becoming Current State 326 which controls MUX 204 of the first instance of table-based state machine 200.

It is apparent in FIG. 3 that the naïve implementation of state machine 300 includes a state dependence chain as denoted by the bold dashed lines of New States 318-322 that are fed forward, as well as New State 324 that is fed back. That is, each of Output[1] 310, Output[2] 312 and Output[3] 314 is not generated until the New State of the prior stage is computed (e.g., each of New State 318-322, respectively) because such New States drive the corresponding MUXes 204 at each stage. Said another way, each of Outputs 310-316 do not become valid until after the delay imposed by the delay of its corresponding MUX 204, and thus obtaining the four outputs that comprise Outputs 310-316 takes a minimum of four delays of MUX 204. Unfortunately, such MUX operations cannot be pipelined because of this dependence. In embodiments, this dependence is removed to enable full pipelining that produces multiple outputs every clock.

Figure 4:
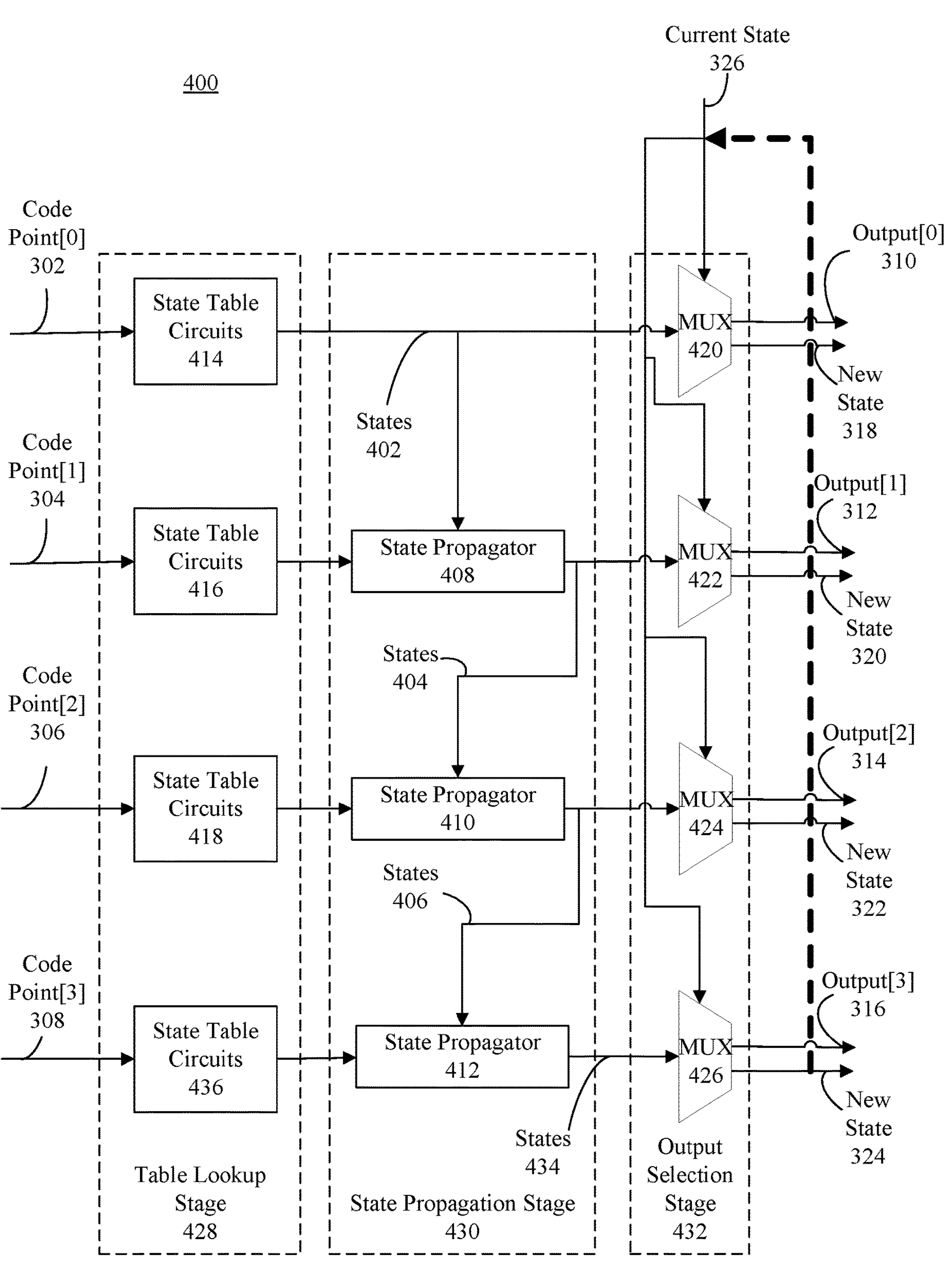
FIG. 4 depicts an example state machine configured to process inputs in parallel, and that improves the state machine of FIG. 3 by eliminating its state dependence, according to an embodiment.

For example, consider FIG. 4 which depicts an example state machine 400 configured to process inputs in parallel, and that improves state machine 300 of FIG. 3 by eliminating its state dependence, according to an embodiment. State machine 400 includes a table lookup stage 428, a state propagation stage 430, and an output selection stage 432. Table lookup stage 428 includes state table circuits 414-418 and 436. Stage propagation stage 430 includes state propagators 408-412, and output selection stage 432 includes MUXs 420-426. Each of state table circuits 414-418 and 436 corresponds to state table circuits 202A-202N of table-based state machine 200 as depicted in FIG. 3. Each of MUX 420-426 likewise corresponds to an instance of MUX 204 of table-based state machine 200 as depicted in FIG. 3. Other structural and operational embodiments will be apparent to persons skilled in the relevant art(s) based on the following discussion regarding state machine 400 of FIG. 4.

As shown in FIG. 4, state table circuits 414-418 and 436 each receive a corresponding one of inputs [0]-[3] 302-308, and generate corresponding output states. State table circuit 414 generates first output states 402 received by state propagator 408 and MUX 420. Each of state table circuit 416-418 and 436 generate respective output states received by a corresponding one of state propagators 408-412. State propagator 408 generates output states 404 received by MUX 422 and state propagator 410. State propagator 410 generates output states 406 received by MUX 424 and state propagator 412. State propagator 412 generates output states 434 received by MUX 426. MUX 420 receives output states 402 and current state 326 and generates output[0] 310 and new state 318. MUX 422 receives output states 404 and current state 326 and generates output[1] 312 and new state 320. MUX 424 receives output states 406 and current state 326 and generates output[2] 314 and new state 322. MUX 426 receives output states 434 and current state 326 and generates output[3] 316 and new state 324.

State machine 400 removes the state dependence inherent to state machine 300 as depicted in FIG. 3 by using the state transitions output from each set of state table circuits to determine the state transition table for later inputs. This process of determining later state transitions may be described as state tracing that may be understood by way of the following example.

Suppose code point[0] 302 and code point[1] 304 equal arbitrary values x and y, respectively, and that the state table lookup for those values and for each possible current state are shown as follows in Table B:

TABLE B

| current state | code point[0] | code point[1] |
|---|---|---|
| 0 | 1 | 2 |
| 1 | 3 | 3 |
| 2 | 2 | 0 |
| 3 | 0 | 1 |

Each table entry shown in Table B indicates the new state dictated by, for example, state table circuits 414 for the respective values of code point[0] 302 and code point[1] 304 for each possible current state. The idea behind state tracing is to determine what the current state corresponding to code point[1] 304 will be (i.e., the new state generated in response to code point[0]) given a particular current state corresponding to code point[0] 302. One may find the new state for code point[1] 302 if the current state to code point[0] is 0 by tracing through Table B.

For instance, FIG. 10 shows a diagram 1000 of a trace through Table B, in accordance with an embodiment. For example, suppose that the current state corresponding to code point[0] is 0. Diagram 1000 shows that for the current input at code point[0] and a current state of 0, the new state will be 1. Next, given a current state of 1 304 (i.e., the new state resulting from code point[0] 302 and its current state of 0) corresponding to code point[1], diagram 1000 illustrates that the new state for code point[1] is 3. The following table shows the tracing and the resulting state transition table for each possible current state given the particular values of code point[0] 302 and code point[1] 304.

TABLE C

| Traced State Transition | | |
|---|---|---|
| current state | code point[0] | code point[1] |
| 0 | 1 | 0→1→3 = 3 |
| 1 | 3 | 1→3→1 = 1 |
| 2 | 2 | 2→2→0 = 0 |
| 3 | 0 | 3→0→2 = 2 |

Table C above illustrates, for example, that for the current values in code point[0] 302 and code point[1] 304 and a current state of 2, the appropriate state corresponding to code point[1] 304 is 0. More detailed operation of state machine 400 and state propagators 408 will now be described with reference to the above described state propagation table.

State machine 400 is very similar to state machine 300, but differs in a few key aspects. First, and with reference to FIGS. 2 and 3 and as described above, each of outputs 206A-206N includes both the possible states, and the possible outputs that will subsequently be selected by the corresponding MUX 204. For the sake of clarity, state machine 400 is depicting only the states being provided by a given set of state tables, and omits the outputs. It should be understood, however, that state table circuits 414-418 and 436 provide both states and outputs to MUXes 420-426 as described herein above with respect to table-based state machine 200. Second, state machine 400 includes state propagators 408-412, the operation of which will be described in further detail below. Third, each of MUXes 420-426 correspond to each MUX 204 depicted in FIG. 3, and are configured to be controlled by the *same* signal. That is, each of MUX 420-426 generate the output for their respective input at the same time according to current state 326. Thus, each of outputs 310-316 become valid at the same time (i.e., on the same clock cycle), and the aforementioned state dependency present in state machine 300 of FIG. 3 is removed. Removal the state dependency is accomplished through the use of state propagators 408-412. Although there is a dependence chain through the state propagation logic (e.g., a series of logic gates, flip-flops, transistors, etc.), the logic itself is not dependent on anything other than the current state and inputs and may thereby be fully pipelined.

For example, and as depicted in state machine 400 of FIG. 4, state table circuits 416-418 and 436 operate in parallel to simultaneously perform their respective table lookups in a pipeline stage denoted as table lookup stage 428. Likewise, state propagation as described below is performed in the pipeline stage denoted as state propagation stage 430. Finally, the final output and state that corresponds to each input are selected simultaneously by respective ones of MUXes 420-426 in output selection stage 432. Moreover, although the layout area and pipeline depth of state machine 400 are both increased, the additional time to fill the pipeline is negligible and thereafter state machine 400 may deliver multiple outputs per clock with a clock period that is less than the sum of the computation delays at each stage (i.e., the clock period need be only as long as required to complete the slowest stage).

Figure 5:
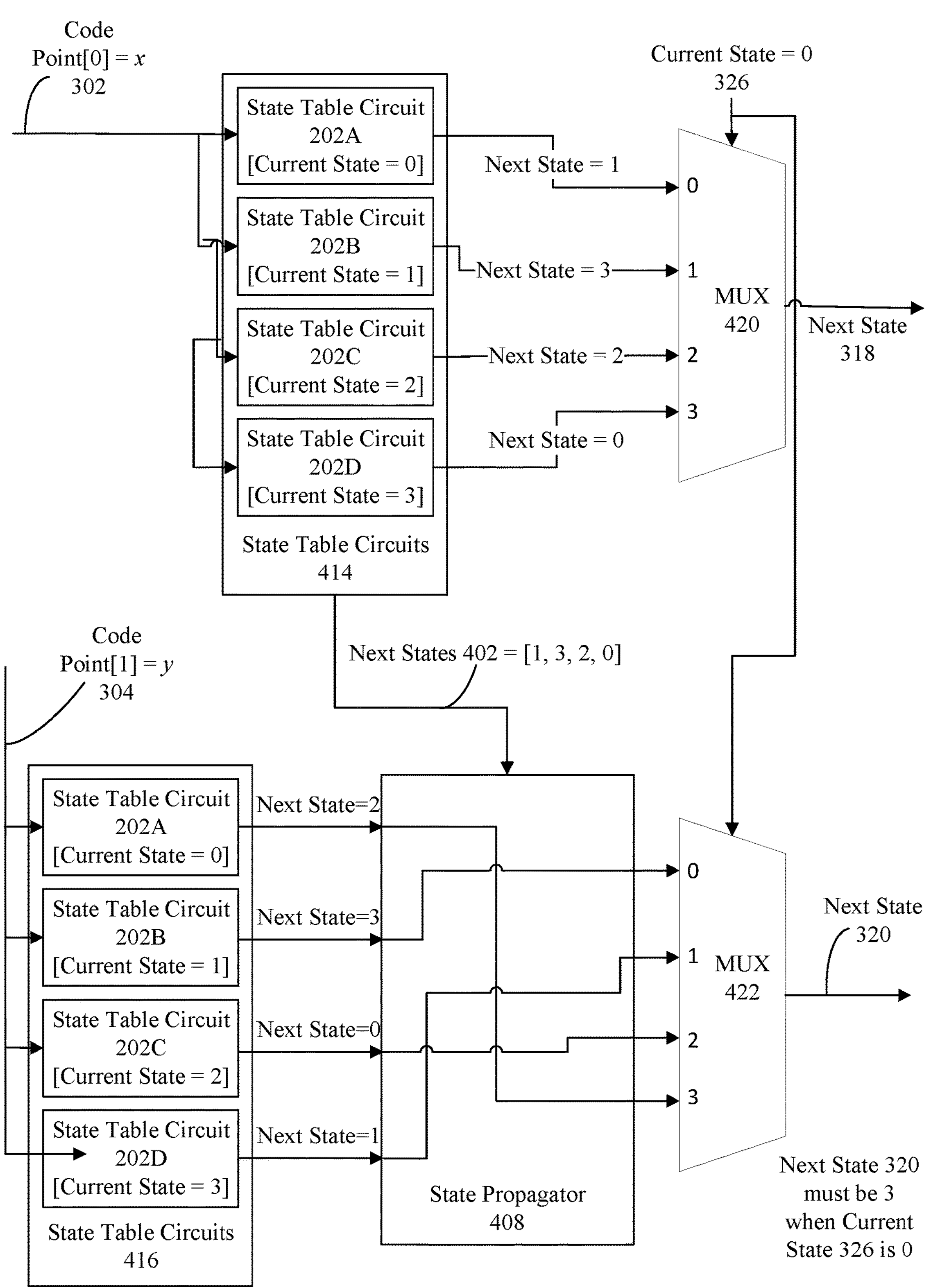
FIG. 5 depicts an excerpted portion of the state machine of FIG. 4 illustrating aspects of state propagator operation, according to an embodiment.

FIG. 5 depicts an excerpted portion 500 of state machine 400 of FIG. 4 illustrating aspects of state propagator 408 operation, according to an embodiment. Portion 500 includes state table circuits 414, state table circuits 416, MUX 420, MUX 422 and state propagator 408. State table circuits 414 and 416 as shown in FIG. 5 each include corresponding instances of state table circuits 202A-202D that correspond to each possible state (as further described above). Other structural and operational embodiments will be apparent to persons skilled in the relevant art(s) based on the following discussion regarding portion 500 of state machine 400 as illustrated in of FIG. 5.

FIG. 5 depicts state machine 400 in the context of the state tracing example, and Table B and Traced State Transition Table C corresponding thereto, as described above. In particular, for illustrative purposes, it is assumed that code point[0] 302 and code point[1] 304 have values x and y, respectively. Further, the states that are output from state table circuits 414 correspond to the values given code point[0] 302=x for each of the possible states. Likewise, the states that are output from state table circuits 416 correspond to the values given code point[1] 304=y for each of the possible states.

State propagator 408 is configured to re-map the state outputs of a given set of state table circuits to account for the traced states as reflected in the Traced State Transition Table C shown above. Suppose, for example, that current state 326=0. Traced State Transition Table C indicates that next state 320 is expected to have a value of 3. Thus, state propagator 408 is configured to route the correct Next State output from State table circuits 416 to input 0 of MUX 422 (input 0 is appropriate because current state 326=0). More specifically, and per the example state table circuits described herein above in the context of this example, state table circuits 416 indicate the state transitions indicated in Table B above, which dictates that for a value of y on code point[1] 304, the next states are 2, 3, 0 and 1 for each of current states 0, 1, 2 and 3, respectively. Recalling that MUX 422 selects the signal line having a 3 on input 0 (because the current state is 0), state propagator 408 selects the next state corresponding to Current State=1 from state table circuits 416 because that next state equals 3.

Continuing with this example, suppose that current state 326 is 3. Per the Traced State Transition Table C shown above, next state 320 selected by MUX 422 is 2 when current state 326 is 3. Accordingly, state propagator 408 selects the next state corresponding to current state=0 in state table circuits 416 because that next state equals 2. By a similar process, one may see that in this example state propagator 408 routes the outputs corresponding to current states 2 and 3 of state table circuits 416 to inputs 2 and 1, respectively, of MUX 422.

With these aspects in mind, it may be appreciated that next states 402 as output from state table circuits 414 provides the exact mapping described herein above. That is, in this example, next states 402=[1, 3, 2, 0] may be used directly by state propagator 408 to route the correct next state to the correct input of MUX 422 because the values of next states 402 correspond one-to-one with inputs 0 through 3 on MUX 422, and such values dictate which of outputs 0 to 3 of state table circuits 416 should be chosen. That is, the state values of Next States 402 may be used to index the Next State outputs of State table circuits 416.

For example, the value of the first element of next states 402 (i.e., the value 1) corresponds to input 0 of MUX 422 and dictates that the output of current state=1 of state table circuits 416 be routed to input 0 by state propagator 408. By that same token, the second element of Next States 402 (i.e., the value 3) corresponds to input 1 of MUX 422 which will receive the value from the state table circuit for current state=3 from state table circuits 416 and so on. Put more simply, the values of next states 402 dictate to state propagator 408 which of next states output from state table circuits 416 to route to each of inputs 0 through 3 of MUX 422. State propagator 408 may accomplish such routing in a number of ways. For example, state propagator 408 may be implemented as a crossbar switch, or with MUXes as depicted in FIG. 6 as will now be described.

Figure 6:
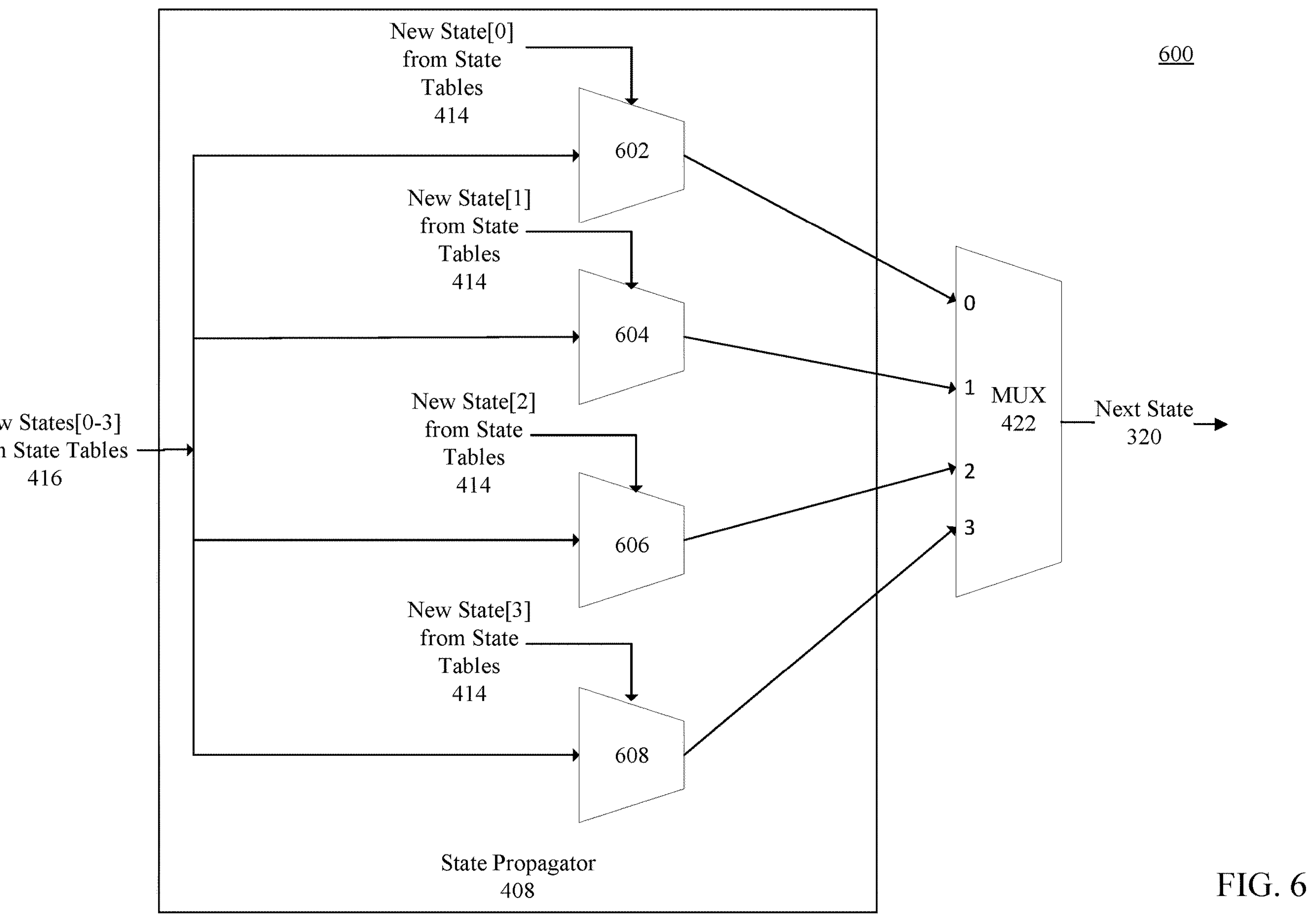
FIG. 6 depicts a block diagram of an example state propagator, according to an embodiment.

FIG. 6 depicts a block diagram of an example system 600 for state propagator 408, according to an embodiment. As shown in FIG. 6, system 600 includes state propagator 408 and MUX 422. Furthermore, state propagator 408 includes first-fourth MUXs 602-608, each of which accepts the new states from state table circuits 416 as the input to be multiplexed. Each of MUXs 602-608 also receives one of the new states output from state table circuits 414 and is configured to switch the multiplexed input from state table circuits 416 to the MUX output. Such outputs are subsequently delivered to, for example, MUX 422 for final selection and output of next state 320 according to the current state as described herein above.

Although the figures and corresponding description herein above illustrates and describes embodiments in terms of state outputs, one of ordinary skill will appreciate that the principles are equally applicable to routing and selection of appropriate output values according to the state table circuits and state propagation logic. For instance, although state propagator 408 and MUX 422 are shown in FIG. 6 and described above, such illustration and description is applicable to other state propagators and MUXs disclosed herein.

Figure 7:
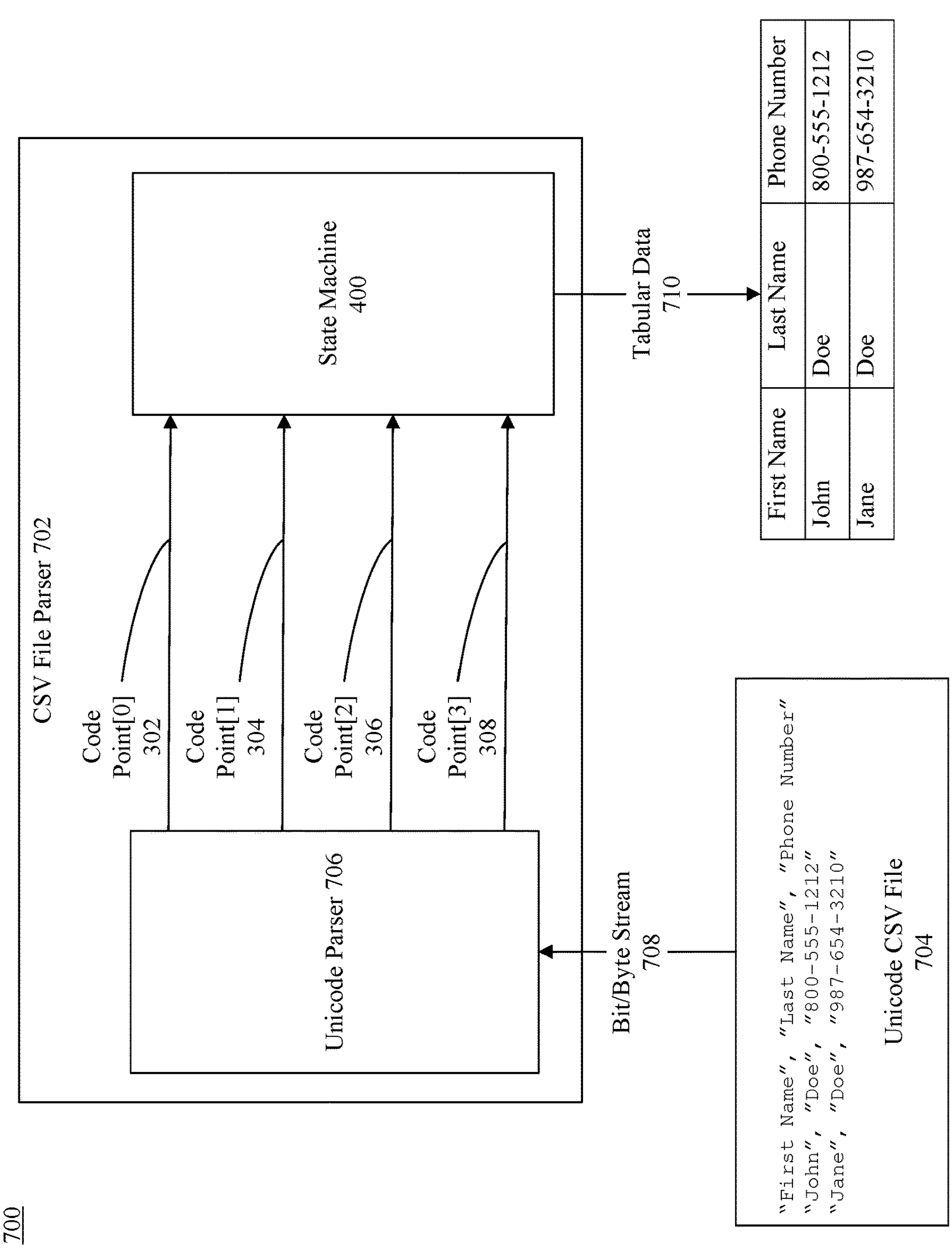
FIG. 7 depicts a block diagram of an example CSV file parser, according to an embodiment.

Embodiments of a text parser may be implemented in various ways. For example, FIG. 7 depicts a block diagram 700 of an example CSV file parser 702, according to an embodiment. 7, CSV file parser 702 includes a Unicode parser 706 and an instance of state machine 400. Other structural and operational embodiments will be apparent to persons skilled in the relevant art(s) based on the following discussion regarding CSV file parser 702 as depicted in FIG. 7.

CSV file parser 702 is configured to accept as input bit/byte stream 708 which comprises a stream of bits or 8-bit bytes read from Unicode CSV File 704. For the purposes of this description, assume that Unicode CSV File 704 is encoded as UTF-8 as described above. In an embodiment, Unicode parser 706 is configured to accept octets from bit/byte stream 708 and to output Unicode code point[0] 302 through code point[3] 308 therefrom according to Unicode decoding methods as known in the art to persons skilled in the relevant art(s).

The four code points comprising code points[0] 302 through code point[3] 308 are together provided in parallel to state machine 400 that is configured as described above to process such code points in parallel, and output tabular data 710.

Other operational embodiments will be apparent to persons skilled in the relevant art(s). Note also that the foregoing general description of the operation of CSV file parser 702 is provided for illustration only, and embodiments of CSV file parser 702 may comprise different hardware and/or software, and may operate in manners different than described above. Indeed, and as described above, the use of UTF-8 is by no means limiting, and embodiments may likewise be implemented to handled other text encoding formats, whether encoded as Unicode or any other character encoding. Likewise, although described in terms of parsing a CSV file, persons skilled in the relevant art(s) will understand that embodiments are not so limited, and embodiments may be readily extended to parse text formatted according to other conventions or standards. For example, JSON and HTML (as mentioned herein above), or Extensible Markup Language ("XML") all have parsing requirements that may be satisfied, at least in part, by embodiments described herein. JSON, for example, has more delimiters and properly parsing nested delimiters could require a state machine with so many states that efficient implementation may pose a challenge. XML is even more complicated since XML delimiters may comprise any valid start and end tag (and such tags may have arbitrary names). Embodiments may nevertheless by employed to perform top-level parsing before passing the result to a parser of a different embodiment, or to a more complicated parser as needed.

For example, a JSON file parser may be based on CSV file parser 702 as shown in FIG. 7, but instead of state machine 400 outputting tabular data 710, one or more outputs of state machine 400 (e.g., tokenized text or some other intermediate parsing result) may be provided to second parser or parser level (e.g., instance of state machine 400) which performs additional parsing of the intermediate result.

Figure 8:
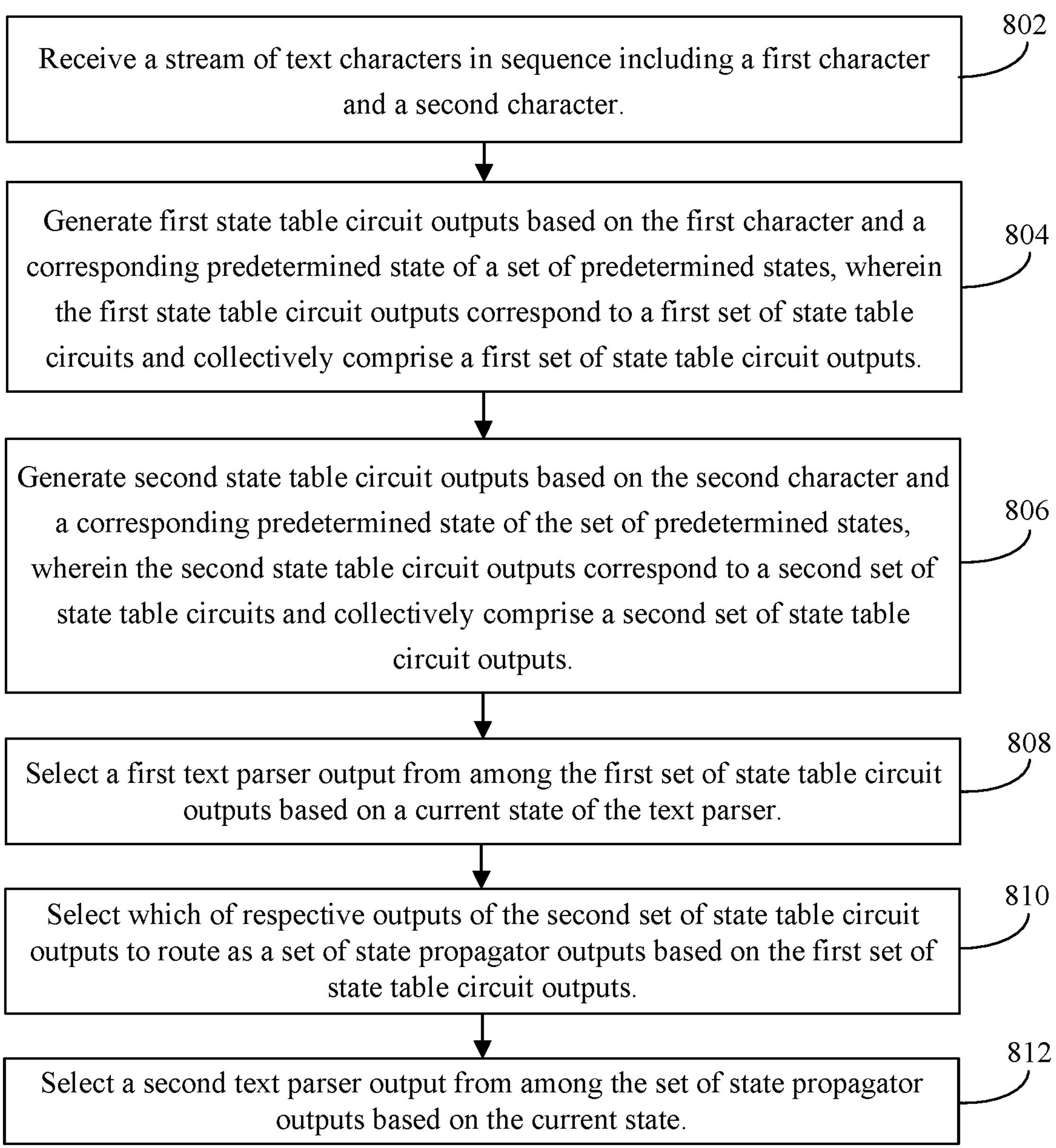
FIG. 8 depicts a flowchart of a method for operating a text parser configured to process inputs in parallel, according to an embodiment.

In embodiments, state table circuit 202A-202N of FIG. 2 and state machine 400 of FIG. 4 may be used in various ways to process characters of a stream in parallel. For instance, FIG. 8 depicts flowchart 800 of a method for operating a text parser configured to process inputs in parallel, according to an embodiment. Flowchart 800 is described with continued reference to FIGS. 2 and 4. However, other structural and operational embodiments will be apparent to persons skilled in the relevant art(s) based on the following discussion regarding flowchart 800.

Flowchart 800 begins at step 802. At step 802, a stream of text characters is received, the sequence including a first character and a second character. For example, and with reference to CSV file parser 702 of FIG. 7, unicode parser 706 is configured to accept a byte stream 708 comprising unicode CSV file 704, and to parse the byte stream to produce the stream of text characters comprising unicode code points[0-3] 302-308 that is thereafter provided to state machine 400. Flowchart 800 continues at step 804.

At step 804, first state table circuit outputs are generated based on the first character and a corresponding predetermined state of a set of predetermined states, wherein the first state table circuit outputs correspond to a first set of state table circuits and collectively comprise a first set of state table circuit outputs. For example, and with reference to state machine 400 of FIG. 4, state table circuits 414-418 and 436 each comprise a set of state tables wherein each state table corresponds to a state within which state machine 400 may be operating. For example, state table circuits 202A-202N of FIG. 2 correspond to states of 0-N (i.e., the predetermined states), respectively, for state machine 400. As described above, the output and next state of state machine 400 depends on the input and the current state of the state machine. By maintaining a lookup table for each of the N-possible states of state machine 400 (i.e., in the form of state table circuits 202A-202N, instances of which are incorporated into each of state table circuits 414-418 and 436), the table lookup is no longer dependent on the current state because all possible outputs and next state values are looked up simultaneously. The outputs of instances of state table circuits 202A-202N comprise the "first state table circuit outputs[.]" Although state machine 400 of FIG. 4 is depicted as generating states 402-406 and 434, and as described above, it should be understood that state table circuits 414-418 and 436 output not only the possible next states, by likewise the possible outputs for subsequent selection by, for example, MUX 420 of FIG. 4.

Flowchart 800 of FIG. 8 continues at step 806. In step 806, second state table circuit outputs are generated based on second character and a corresponding predetermined state of the set of predetermined states, wherein the second state table circuit outputs correspond to a second set of state table circuits and collectively comprise a second set of state table circuit outputs. For example, and with continued reference to state machine 400 of FIG. 4, the second state table circuit outputs are, for example, those generated by any of state table circuits 416, 418 or 436. For example, suppose that the second input comprises input[1] 304. In such an instance, second state table circuit outputs are those outputs generated by state table circuits 416. Flowchart 800 of FIG. 8 continues at step 808.

In step 808, a first text parser output is selected from among the first set of state table circuit outputs based on a current state of the text parser. For example, and with continued reference to state machine 400 of FIG. 4, MUX 420 receives the possible next states and possible outputs from state table circuits 414, and selects the appropriate state and output based on current state 326, wherein the first state machine output corresponds to output[0] 310.

Flowchart 800 of FIG. 8 continues at step 810. In step 810, respective outputs of the second set of state table circuit outputs are selected to route as a set of state propagator outputs based on the first set of state table circuit outputs. For example, and with continued reference to state machine 400 of FIG. 4, state propagator 408 is configured to receive the outputs of state table circuits 416, and to select the appropriate set of state propagator outputs to route to MUX 422 based on states 402. For example, and with reference to FIG. 6, state propagator 408 may comprise MUXes 602-608 of FIG. 6, each MUX configured to receive a respective one of possible states/outputs from state table circuits 414, and thereafter use such to select the appropriate state of New States[0-3] from state table circuits 416 to route to MUX 422, all as depicted in FIG. 6. This operation of state propagator 408 serves to perform the state tracing operation described in greater detail herein above, thereby removing any dependence state machine 400 would otherwise have on the current state of state machine 400.

Flowchart 800 of FIG. 8 concludes at step 812. In step 812, a second text parser output is selected from among the set of state propagator outputs based on the current state. For example, and with continued reference to state machine 400 of FIG. 4, the outputs of state propagator 408 that were selected therein from among the outputs of state table circuits 416 are received by MUX 422, and thereafter the appropriate one of the respective outputs and new state corresponding to that input is selected by MUX 422 as dictated by the selection signal provided thereto (i.e., current state 326 of state machine 400 which comprises the fed-back new state 324 as output by MUX 426.

In the foregoing discussion of steps 804-812 of flowchart 800, it should be understood that at times, such steps may be performed in a different order or even contemporaneously with other steps. For example, the selection of steps 808 may be performed after the selections of steps 810 and/or 812, or may be performed at least partially in parallel. It should likewise be understood that although flowchart 800 describes a method of operating state machine 400 in a manner that processes only two inputs (i.e., the first and second inputs) in parallel, it may be appreciated that the method described in flowchart 800 of FIG. 8 may be extended to process any number of inputs. For example, and as shown in FIG. 4, state machine 400 may be configured to process 4 inputs (i.e., input[0]-input[3] 302-308 in parallel. Other operational embodiments will be apparent to persons skilled in the relevant art(s). Note also that the foregoing general description of the operation of state machine 400 is provided for illustration only, and embodiments of state machine 400 may comprise different hardware and/or software, and may operate in manners different than described above.

One may likewise appreciate that the maximum clock frequency is limited by how fast the MUXes may operate, which in turn is limited by the size of the MUX. As described herein above, the MUX size is dictated 1-for-1 by the number of states in the machine. However, embodiments herein may employ further optimization techniques to keep the size of the MUXes manageable for state machines with a large possible number of states. More specifically, and as briefly described herein above, embodiments may use sparse state transition tables when the number of unique transitions for a given input is small for a particular application. That is, embodiments may store state transitions in a sparse manner thereby limiting the size of MUX required.

Consider, for example, the following partial state transition table, Dense State Transition Table D:

TABLE D

| Dense State Transition | | |
|---|---|---|
| Input | Current State | Next State |
| A | 0 | 0 |
| | 1 | 0 |
| | 2 | 0 |
| | 3 | 1 |
| B | 0 | 1 |
| | 1 | 1 |
| | 2 | 2 |
| | 3 | 1 |

Dense State Transition Table D is "dense" since, as described above, it enumerates a 'next state' for every possible combination of input and current state. Note, however, that while there are 4 possible current states, there are only two unique state transitions. That is, for any given state and input, the 'next state' takes on only two values. For an input of 'A', the 'next state' can only be 0 or 1 no matter what the current state may be., Likewise, for input 'B', the 'next state' can only be 1 or 2 and again, no matter what the current state may be. Accordingly, one may simplify the dense table to arrive at Sparse State Transition Table E:

TABLE E

| Sparse State Transition | | |
|---|---|---|
| Input | Current State | Next State |
| A | 3 | 1 |
| | Default | 0 |
| B | 2 | 2 |
| | Default | 1 |

Sparse State Transition Table E shown above is a "sparse" transition table since it expressly enumerates the 'next state' for each unique state transition and enumerates at least one 'next state' common to multiple, non-unique state transitions. In particular, Sparse State Transition Table E only enumerates the 'next state' of 1 that uniquely occurs for an input of A and current state of 3. Given the same input of A, and any other state, the next state is always 0. Thus, a MUX such as, for example MUX 420 as illustrated in FIG. 4 only needs to multiplex between two possible next states for the shown inputs. Said another way, state table circuits 414 of FIG. that implement or employ a state transition table such as Sparse State Transition Table E have only two state outputs, 1 or 0, with the former being selected by MUX 420 for a current state of 3, and having a default output of 0 for any other current state. Thus, MUX 420 needs to switch between only two inputs instead of 4. In this example, the overall reduction is small compared to the original shown above. However, it should be understood that these tables are merely exemplary and the reduction may be more significant for larger tables.

In this example, the output of a state table circuit such as, for example, state table circuits 414 as depicted in FIG. 4 is now pairs of (current state, next state). In order to mux among the next states, the actual current state has to be compared against these possible current states to determine which next state is to be used. If it matches none of the specified current states, then the default transition is used.

Where multiple inputs are being processed in parallel, such as with state machine 400 as depicted in FIG. 4, it is sometimes possible to further sparsify the number of valid state transitions because for certain inputs considered together, only certain states may be possible. For example, using the Dense State Transition Table D shown above, consider an input of A followed by B. The input of A can only result in next states of 1 or 0. Thus, the next state for the input of B can only be 1.

In the above examples, we have assumed that all possible input states for an input are valid. However, this is not always the case. For some state machines, some input and current state combinations are not valid. For example, consider this new transition table, State Transition Table with Invalid Inputs E:

State Transition Table with Invalid Inputs E

| Input | Current State | Next State |
|---|---|---|
| A | 0 | Error |
| | 1 | 0 |
| | 2 | Error |
| | 3 | 1 |
| B | 0 | Error |
| | 1 | 1 |
| | 2 | 2 |
| | 3 | Error |

State Transition Table with Invalid Inputs E may be similarly sparsified yielding the following table, Sparsified State Transition Table with Invalid Inputs F:

Sparsified State Transition Table with Invalid Inputs F

| Input | Current State | Next State |
|---|---|---|
| A | 1 | 0 |
| | 3 | 1 |
| B | 0 | 1 |
| | 3 | 2 |

In the case of Sparsified State Transition Table with Invalid Inputs F, one may also use dynamic information to reduce the number of possible starting states to a sequence of inputs. Again considering inputs of A followed by B, the only possible starting states for an input of B are 0 and 3. If we look at the possible next states for A, the only valid one is 0 which corresponds to a current state of 1. In such a situation, the state transition for input A corresponding to state transition (3,1) may be eliminated from the state transition table.

At runtime, embodiments may use the above two techniques to reduce the number of sparse transitions. Further improvement is possible by profiling the state machine while operating a typical workload to determine the choice of hardware MUX size based on the average or typical number of transitions after sparsification. Optimizing MUX size in this manner permits further increase in the clock frequency due to reduced delay of the MUX. Of course, a slower fallback path will be needed to handle any situation where the number of transitions exceeds the optimized MUX size.

III. Example Computer System Implementation

Each of state table circuit 102, state table circuits 202A-202N, MUX 204, state table circuits 414-418 and 436, state propagators 408-412, MUXes 420-426, MUXes 602-608, CSV file parser 702, Unicode parser 706 and/or flowchart 800 may be implemented in hardware, or hardware combined with software and/or firmware. For example, state table circuit 102, state table circuits 202A-202N, MUX 204, state table circuits 414-418 and 436, state propagators 408-412, MUXes 420-426, MUXes 602-608, CSV file parser 702, Unicode parser 706 and/or flowchart 800 may be implemented as computer program code/instructions configured to be executed in one or more processors and stored in a computer readable storage medium. Alternatively, state table circuit 102, state table circuits 202A-202N, MUX 204, state table circuits 414-418 and 436, state propagators 408-412, MUXes 420-426, MUXes 602-608, CSV file parser 702, Unicode parser 706 and/or flowchart 800 may be implemented as hardware logic/electrical circuitry.

For instance, in an embodiment, one or more, in any combination, of state table circuit 102, state table circuits 202A-202N, MUX 204, state table circuits 414-418 and 436, state propagators 408-412, MUXes 420-426, MUXes 602-608, CSV file parser 702, Unicode parser 706 and/or flowchart 800 may be implemented together in a SoC. The SoC may include an integrated circuit chip that includes one or more of a processor (e.g., a central processing unit (CPU), microcontroller, microprocessor, digital signal processor (DSP), etc.), memory, one or more communication interfaces, and/or further circuits, and may optionally execute received program code and/or include embedded firmware to perform functions.

Figure 9:
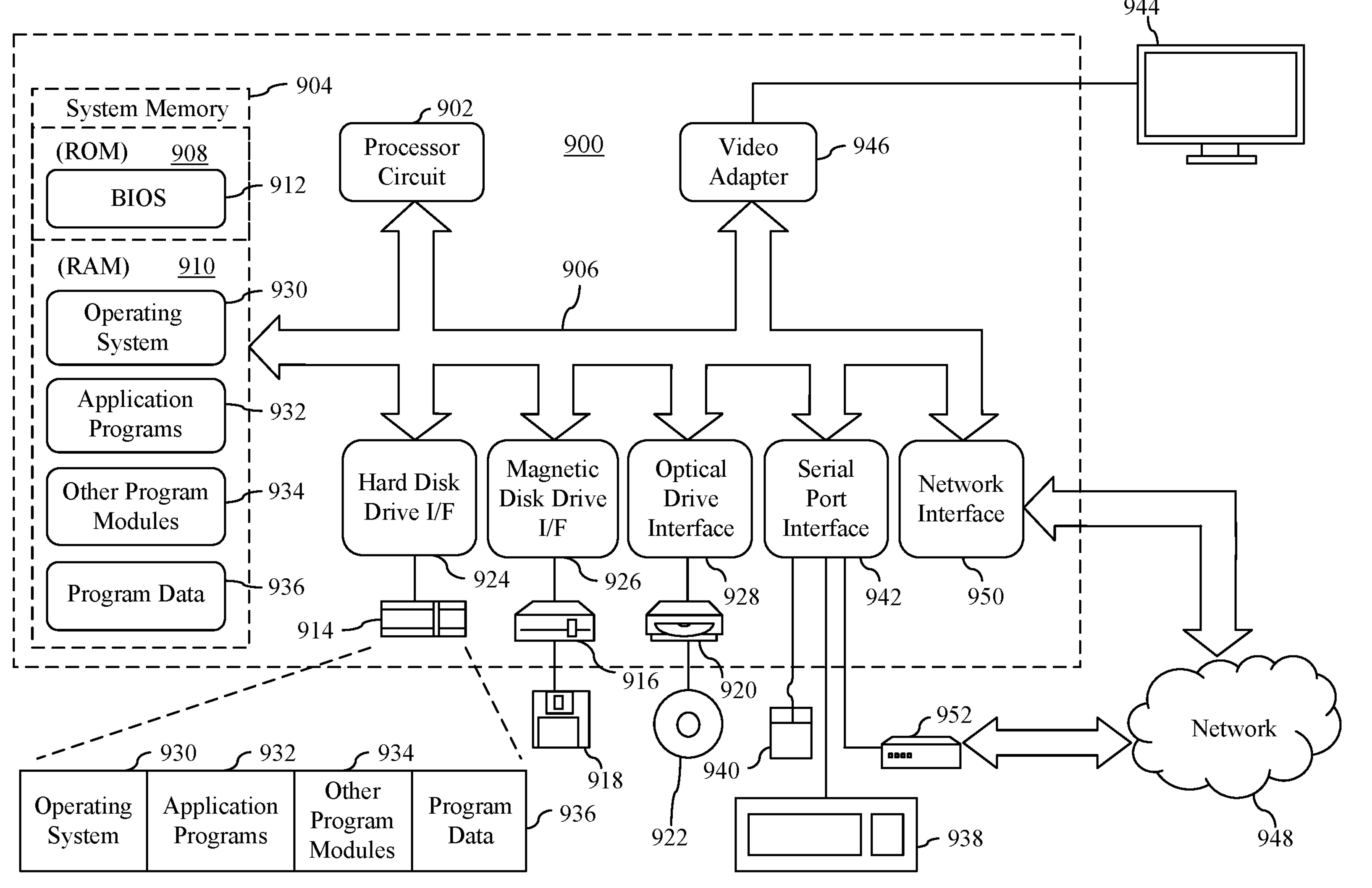
FIG. 9 is a block diagram of an example computer system in which embodiments may be implemented.

FIG. 9 depicts an exemplary implementation of a computing device 900 in which embodiments may be implemented. For example, in an embodiment, one or more in any combination of state table circuit 102, state table circuits 202A-202N, MUX 204, state table circuits 414-418 and 436, state propagators 408-412, MUXes 420-426, MUXes 602-608, CSV file parser 702, Unicode parser 706 and/or flowchart 800 may be implemented in one or more computing devices similar to computing device 900 in stationary or mobile computer embodiments, including one or more features of computing device 900 and/or alternative features. The description of computing device 900 provided herein is provided for purposes of illustration and is not intended to be limiting. Embodiments may be implemented in further types of computer systems, as would be known to persons skilled in the relevant art(s).

As shown in FIG. 9, computing device 900 includes one or more processors, referred to as processor circuit 902, a system memory 904, and a bus 906 that couples various system components including system memory 904 to processor circuit 902. Processor circuit 902 is an electrical and/or optical circuit implemented in one or more physical hardware electrical circuit device elements and/or integrated circuit devices (semiconductor material chips or dies) as a central processing unit (CPU), a microcontroller, a microprocessor, and/or other physical hardware processor circuit. Processor circuit 902 may execute program code stored in a computer readable medium, such as program code of operating system 930, application programs 932, other programs 934, etc. Bus 906 represents one or more of any of several types of bus structures, including a memory bus or memory controller, a peripheral bus, an accelerated graphics port, and a processor or local bus using any of a variety of bus architectures. System memory 904 includes read only memory (ROM) 908 and random access memory (RAM) 910. A basic input/output system 912 (BIOS) is stored in ROM 908.

Computing device 900 also has one or more of the following drives: a hard disk drive 914 for reading from and writing to a hard disk, a magnetic disk drive 916 for reading from or writing to a removable magnetic disk 918, and an optical disk drive 920 for reading from or writing to a removable optical disk 922 such as a CD ROM, DVD ROM, or other optical media. Hard disk drive 914, magnetic disk drive 916, and optical disk drive 920 are connected to bus 906 by a hard disk drive interface 924, a magnetic disk drive interface 926, and an optical drive interface 928, respectively. The drives and their associated computer-readable media provide nonvolatile storage of computer-readable instructions, data structures, program modules and other data for the computer. Although a hard disk, a removable magnetic disk and a removable optical disk are described, other types of hardware-based computer-readable storage media can be used to store data, such as flash memory cards, digital video disks, RAMS, ROMs, and other hardware storage media.

A number of program modules may be stored on the hard disk, magnetic disk, optical disk, ROM, or RAM. These programs include operating system 930, one or more application programs 932, other programs 934, and program data 936. Application programs 932 or other programs 934 may include, for example, computer program logic (e.g., computer program code or instructions) for implementing of state table circuit 102, state table circuits 202A-202N, MUX 204, state table circuits 414-418 and 436, state propagators 408-412, MUXes 420-426, MUXes 602-608, CSV file parser 702, Unicode parser 706 and/or flowchart 800 and/or further embodiments described herein.

A user may enter commands and information into the computing device 900 through input devices such as keyboard 938 and pointing device 940. Other input devices (not shown) may include a microphone, joystick, game pad, satellite dish, scanner, a touch screen and/or touch pad, a voice recognition system to receive voice input, a gesture recognition system to receive gesture input, or the like. These and other input devices are often connected to processor circuit 902 through a serial port interface 942 that is coupled to bus 906, but may be connected by other interfaces, such as a parallel port, game port, or a universal serial bus (USB).

A display screen 944 is also connected to bus 906 via an interface, such as a video adapter 946. Display screen 944 may be external to or incorporated in computing device 900. Display screen 944 may display information, as well as being a user interface for receiving user commands and/or other information (e.g., by touch, finger gestures, virtual keyboard, etc.). In addition to display screen 944, computing device 900 may include other peripheral output devices (not shown) such as speakers and printers.

Computing device 900 is connected to a network 948 (e.g., the Internet) through an adaptor or network interface 950, a modem 952, or other means for establishing communications over the network. Modem 952, which may be internal or external, may be connected to bus 906 via serial port interface 942, as shown in FIG. 9, or may be connected to bus 906 using another interface type, including a parallel interface.

As used herein, the terms "computer program medium," "computer-readable medium," and "computer-readable storage medium" are used to refer to physical hardware media such as the hard disk associated with hard disk drive 914, removable magnetic disk 918, removable optical disk 922, other physical hardware media such as RAMs, ROMs, flash memory cards, digital video disks, zip disks, MEMs, nanotechnology-based storage devices, and further types of physical/tangible hardware storage media. Such computer-readable storage media are distinguished from and non-overlapping with communication media (do not include communication media). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media. Embodiments are also directed to such communication media that are separate and non-overlapping with embodiments directed to computer-readable storage media.

As noted above, computer programs and modules (including application programs 932 and other programs 934) may be stored on the hard disk, magnetic disk, optical disk, ROM, RAM, or other hardware storage medium. Such computer programs may also be received via network interface 950, serial port interface 942, or any other interface type. Such computer programs, when executed or loaded by an application, enable computing device 900 to implement features of embodiments described herein. Accordingly, such computer programs represent controllers of the computing device 900.

Embodiments are also directed to computer program products comprising computer code or instructions stored on any computer-readable medium. Such computer program products include hard disk drives, optical disk drives, memory device packages, portable memory sticks, memory cards, and other types of physical storage hardware.

IV. Additional Example Embodiments

A text parser configured to process multiple input characters from a stream of characters in parallel is provided herein. The first text parser comprises: a first set of state table circuits, each state table circuit of the first set corresponding to a predetermined state of a set of predetermined states and configured to generate first state table circuit outputs based on a first input character of the stream of characters and the corresponding predetermined state, wherein the first state table circuit outputs corresponding to each state table circuit of the first set of state table circuits collectively comprise a first set of state table circuit outputs; a second set of state table circuits, each state table circuit of the second set corresponding to a predetermined state of the set of predetermined states and configured to generate second state table circuit outputs based on a second input character of the stream of characters and the corresponding predetermined state, wherein the second state table circuit outputs corresponding to each state table circuit of the second set of state table circuits comprise a second set of state table circuit outputs; a first output multiplexer (MUX) configured to receive the first set of state table circuit outputs and a current state of the first text parser, and to select a first text parser output from among the first set of state table circuit outputs based on the current state; a state propagator configured to receive the first and second sets of state table circuit outputs and to select which of respective outputs of the second set of state table circuit outputs to route to respective outputs of the state propagator based on the first set of state table circuit outputs, said respective outputs comprising a set of state propagator outputs; and a second output MUX configured to receive the set of state propagator outputs and the current state of the first text parser, and to select a second text parser output from among the set of state propagator outputs based on the current state.

In an embodiment of the foregoing text parser, the text parser further comprises a second text parser configured to accept at least one of the first text parser output and the second text parser output, and to parse the at least one of the first text parser output and the second text parser output to generate a third parser output.

In an embodiment of the foregoing text parser, each state table circuit output of the first and second sets of state table circuit outputs comprises an output value and a state value, and wherein the first and second text parser outputs comprise output values.

In an embodiment of the foregoing text parser, the state propagator is further configured to select which of respective ones of the second set of state table circuit outputs to route to respective outputs of the state propagator based on the state values corresponding to each state table circuit output of the first set of state table circuit outputs.

In an embodiment of the foregoing text parser, the text parser further comprises one or more additional input stages, each of the one or more additional input stages configured to receive one or more additional input characters of the stream of characters, respectively, the one or more additional input characters of the stream of characters being temporally between the first and second input characters, the one or more additional input stages including: an additional set of state table circuits, each state table circuit of the additional set corresponding to a predetermined state of the set of predetermined states and configured to generate a state table circuit output based on a respective one of the one or more additional inputs and the corresponding predetermined state, wherein the state table circuit outputs corresponding to each state table circuit of the additional set of state table circuits collectively comprise an additional set of state table circuit outputs; an additional state propagator configured to receive the additional set of state table circuit outputs and to route each of the outputs of the additional set of state table circuit outputs to respective outputs of the additional state propagator based on the state values corresponding to the state table circuit outputs received from a state table circuit that corresponds to a temporally next input character of the stream of characters; and an additional output MUX configured to receive the additional set of state table circuit outputs and the current state of the text parser, and to select an additional text parser output from among the additional set of state table circuit outputs based on the current state of the text parser.

In an embodiment of the foregoing text parser, at least one state table circuit of the first set of state table circuits, the second set of state table circuits or additional set of state table circuits includes a sparse state transition table.

A method for a text parser configured to process inputs in parallel is provided herein. The method comprising: receiving a stream of text characters in sequence including a first character and a second character; generating first state table circuit outputs based on the first character and a corresponding predetermined state of a set of predetermined states, wherein the first state table circuit outputs correspond to a first set of state table circuits and collectively comprise a first set of state table circuit outputs; generating second state table circuit outputs based on the second character and a corresponding predetermined state of the set of predetermined states, wherein the second state table circuit outputs correspond to a second set of state table circuits and collectively comprise a second set of state table circuit outputs; selecting a first text parser output from among the first set of state table circuit outputs based on a current state of the text parser; selecting which of respective outputs of the second set of state table circuit outputs to route as a set of state propagator outputs based on the first set of state table circuit outputs; and selecting a second text parser output from among the set of state propagator outputs based on the current state.

In an embodiment of the foregoing method, the method further comprises parsing at least one of the first text parser output and the second text parser output to generate a third text parser output.

In an embodiment of the foregoing method, each state table circuit output of the first and second sets of state table circuit outputs comprises an output value and a state value, and wherein the first and second text parser outputs comprise output values. In an embodiment of the foregoing method, selecting the respective outputs of the second set of state table circuit outputs further comprises selecting the respective ones of the second set of state table circuit outputs to route to respective outputs of the state propagator based on the state values corresponding to each state table circuit output of the first set of state table circuit outputs.

In an embodiment of the foregoing method, the method further comprises generating one or more additional text parser outputs, each of the one or more additional text parser outputs corresponding to a respective of one or more additional characters of the stream of text characters, the one or more additional characters being temporally between the first and second characters, said generating comprising for each of the one or more additional characters: generating an additional set of state table circuit outputs based on the respective one of the one or more additional characters and a corresponding predetermined state of a set of predetermined states; selecting which of respective outputs of the additional set of state table circuit outputs to route as an additional set of state propagator outputs based on the values of a set of state table circuit outputs that correspond to a temporally next characters of the stream of text characters; and selecting the respective one of the one or more additional text parser outputs from among the additional set of state propagator outputs based on the current state.

In an embodiment of the foregoing method, the method further comprises generating at least one of the first set of state table circuit outputs, second set of state table circuit outputs or additional set of state table circuit outputs based on a sparse state transition table.

In an embodiment of the foregoing method, the method further comprises operating the text parser by pipelining the steps of generating an additional set of state table circuit outputs, selecting which of respective outputs of the additional set of state table circuit outputs and selecting the respective one of the one or more additional text parser outputs.

A computer program product comprising a computer-readable memory device having computer program logic recorded thereon that when executed by at least one processor of a computing device causes the at least one processor to perform operations implementing a text parser configured to process text characters in parallel is provided herein. The operations comprise: receiving a stream of text characters in sequence including a first character and a second character; generating first state table circuit outputs based on the first character and a corresponding predetermined state of a set of predetermined states, wherein the first state table circuit outputs correspond to a first set of state table circuits and collectively comprise a first set of state table circuit outputs; generating second state table circuit outputs based on the second character and a corresponding predetermined state of the set of predetermined states, wherein the second state table circuit outputs correspond to a second set of state table circuits and collectively comprise a second set of state table circuit outputs; selecting a first text parser output from among the first set of state table circuit outputs based on a current state of the text parser; selecting which of respective outputs of the second set of state table circuit outputs to route as a set of state propagator outputs based on the first set of state table circuit outputs; and selecting a second text parser output from among the set of state propagator outputs based on the current state.

In an embodiment of the foregoing computer program product, the operations further comprise parsing at least one of the first text parser output and the second text parser output to generate a third text parser output.

In an embodiment of the foregoing computer program product, each state table circuit output of the first and second sets of state table circuit outputs comprises an output value and a state value, and wherein the first and second text parser outputs comprise output values.

In an embodiment of the foregoing computer program product, selecting the first text parser output comprises selecting an output value from among the output values that correspond to each state table circuit output of the first set of state table circuit outputs.

In an embodiment of the foregoing computer program product, the operations further comprise: generating one or more additional text parser outputs, each of the one or more additional text parser outputs corresponding to a respective of one or more additional characters of the stream of text characters, the one or more additional characters being temporally between the first and second characters, said generating comprising for each of the one or more additional characters: generating an additional set of state table circuit outputs based on the respective one of the one or more additional characters and a corresponding predetermined state of a set of predetermined states; selecting which of respective outputs of the additional set of state table circuit outputs to route as an additional set of state propagator outputs based on the values of a set of state table circuit outputs that correspond to a temporally next character of the stream of characters; and selecting the respective one of the one or more additional text parser outputs from among the additional set of state propagator outputs based on the current state of the text parser.

In an embodiment of the foregoing computer program product, the operations further comprise pipelining the steps of generating an additional set of state table circuit outputs, selecting which of respective outputs of the additional set of state table circuit outputs and selecting the respective one of the one or more additional text parser outputs.

V. Conclusion

While various embodiments of the disclosed subject matter have been described above, it should be understood that they have been presented by way of example only, and not limitation. It will be understood by those skilled in the relevant art(s) that various changes in form and details may be made therein without departing from the spirit and scope of the embodiments as defined in the appended claims. Accordingly, the breadth and scope of the disclosed subject matter should not be limited by any of the above-described exemplary embodiments, but should be defined only in accordance with the following claims and their equivalents.

What is claimed is:

1. A circuit-based text parser configured to process multiple input characters from a stream of characters in parallel, comprising:

a state machine that:

receives a stream of characters in sequence, the stream of characters comprising a first character and a second character;

utilizes a set of state table circuits to select, based on the first character and a first predetermined state of a set of predetermined states and without a value of a current state of the text parser as input, a first possible state from a first state table circuit of the set of state table circuits and to select, based on the first character and a second predetermined state of the set of predetermined states and without the value of the current state as input, a second possible state from a second state table circuit of the set of state table circuits, the selection of the first possible state and the selection of the second possible state removing a dependence of state table reads on the current state;

pipelines the second character utilizing the set of state table circuits; and utilizes an iteration interval circuit to select a first text parser output from among the first possible state and the second possible state in a reduced iteration interval based on the current state.

2. The circuit-based text parser of claim 1, wherein the first state table circuit comprises a sparse state transition table.

3. The circuit-based text parser of claim 1, wherein the stream of characters comprises a third character, and the state machine further:

selects a second set of possible states from a second set of state tables without the value of the current state as the input, each possible state of the second set of possible states selected based on the third character and a corresponding predetermined state of the set of predetermined states;

selects a set of state propagation outputs from among the second set of possible states based on a first set of possible states; and selects a second text parser output from among the set of state propagation outputs based on the current state.

4. The circuit-based text parser of claim 3, wherein each possible state of the second set of possible states comprises an output value and a state value, and wherein the second text parser output comprise output values.

5. The circuit-based text parser of claim 4, wherein the state machine further selects which of respective states of the second set of possible states to route as the set of state propagation outputs based on state values corresponding to at least the first possible state and the second possible state.

6. The circuit-based text parser of claim 1, wherein the state machine comprises:

the first state table circuit comprising a first state table; and the second state table circuit comprising a second state table.

7. The circuit-based text parser of claim 1, wherein the iteration interval circuit comprises an output multiplexer (MUX) and, to utilize the iteration interval circuit to select the first text parser output, the state machine:

utilizes the output MUX to select the first text parser output from among the first possible state and the second possible state in a reduced iteration interval based on the current state.

8. A circuit-implemented method for processing input characters in parallel by a text parser, comprising:

receiving a stream of text characters in sequence, the stream of characters comprising a first character and a second character;

utilizing a set of state table circuits to select, based on the first character and a first predetermined state of a set of predetermined states and without a value of a current state of the text parser as input, a first possible state and to select, based on the first character and a second predetermined state of the set of predetermined states and without the value of the current state as input, a second possible state from a second state table of the set of state table circuits, the selection of the first possible state and the selection of the second possible state removing a dependence of state table reads on the current state;

pipelining the second character utilizing the set of state table circuits; and utilizing an iteration interval circuit to select a first text parser output from among the first possible state and the second possible state in a reduced iteration interval based on the current state.

9. The circuit-implemented method of claim 8, wherein the first state table circuit comprises a sparse state transition table.

10. The circuit-implemented method of claim 8, wherein the stream of characters comprises a third character, and the method further comprises:

selecting a second set of possible states from a second set of tables without the value of the current state as the input, each possible state of the second set of possible states selected based on the third character and a corresponding predetermined state of the set of predetermined states;

selecting a set of state propagation outputs from among the second set of possible states based on a first set of possible states; and selecting a second text parser output from among the set of state propagation outputs based on the current state.

11. The circuit-implemented method of claim 10, wherein the first set of possible states comprises the first possible state and the second possible state, wherein each possible state of the first set of possible states and the second set of possible states comprise an output value and a state value, and wherein the first text parser output and the second text parser output comprise output values.

12. The circuit-implemented method of claim 11, wherein said selecting the set of state propagation outputs comprises:

selecting which of respective ones of the second set of possible states to route as respective ones of the set of state propagation outputs based on the state values corresponding to each possible state of the first set of possible states.

13. A system comprising:

a processor; and a memory device storing program instructions executable by the processor, the program instructions comprising:

a first text parser that:

receives a stream of text characters in sequence, the stream of characters comprising a first character and a second character, utilizes a first set of state table circuits to select, based on the first character and a first predetermined state of a set of predetermined states and without a value of a current state of the text parser as input, a first possible state from a first state table circuit of the first set of state table circuits and to select, based on the first character and a second predetermined state of the set of predetermined states and without the value of the current state as input, a second possible state from a second state table circuit of the first set of state table circuits, the selection of the first possible state and the selection of the second possible state removing a dependence of state table reads on the current state, pipelines the second character utilizing the set of state table circuits, and utilizes an iteration interval circuit to select a first text parser output from among the first possible state and the second possible state in a reduced iteration interval based on the current state.

14. The system of claim 13, wherein the first state table circuit comprises a sparse state transition table.

15. The system of claim 13 further comprising a second text parser that:

accepts the first text parser output; and parses the first text parser output to generate a second text parser output.

16. The system of claim 13, wherein the stream of characters comprises a third character, and the first text parser further:

selects a second set of possible states from a second set of state tables without the value of the current state as the input, each possible state of the second set of possible states selected based on the third character and a corresponding predetermined state of the set of predetermined states;

selects a set of state propagation outputs from among the second set of possible states based on a first set of possible states; and selects a second text parser output from among the set of state propagation outputs based on the current state.

17. The system of claim 16, wherein the first set of possible states comprises the first possible state and the second possible state, wherein each possible state of the first set of possible states and the second set of possible states comprise an output value and a state value, and wherein the first text parser output and the second text parser output comprise output values, and wherein the first text parser selects which of respective states of the second set of possible states to route as the set of state propagation outputs based on the state values corresponding to each state of the first set of possible states.

18. The circuit-implemented method of claim 8, wherein the iteration interval circuit comprises an output multiplexer (MUX) and, said utilizing the iteration interval circuit to select the first text parser output comprises:

utilizing the output MUX to select the first text parser output from among the first possible state and the second possible state in a reduced iteration interval based on the current state.

19. The system of claim 13, further comprising the iteration interval circuit, the interval circuit comprising:

an output multiplexer (MUX), wherein the first text parser utilizes the output MUX to select the first text parser output from among the first possible state and the second possible state in a reduced iteration interval based on the current state.

20. The system of claim 13, further comprising:

a first state machine comprising the first set of state table circuits and the interval circuit; and a second state machine comprising a second set of state table circuits and another interval circuit, wherein the first state machine utilizes the first set of state table circuits to select the first possible state and the second possible state simultaneous to the second state machine utilizing the second set of state table circuits to select a third possible state and a fourth possible state.

* * * * *